US00RE39835E

(19) United States
(12) Reissued Patent
Kanga

(10) Patent Number: US RE39,835 E
(45) Date of Reissued Patent: Sep. 11, 2007

(54) UV-ABSORBING SUPPORT LAYERS AND FLEXOGRAPHIC PRINTING ELEMENTS COMPRISING SAME

(76) Inventor: Rustom Sam Kanga, 1760 N. Milford Creek La., Marietta, GA (US) 30008

(21) Appl. No.: 10/752,484

(22) Filed: Jan. 6, 2004

Related U.S. Patent Documents

Reissue of:
(64) Patent No.: 6,413,699
Issued: Jul. 2, 2002
Appl. No.: 09/415,811
Filed: Oct. 11, 1999

(51) Int. Cl.
*G03F 7/09* (2006.01)

(52) U.S. Cl. ..... 430/302; 430/271.1; 430/273.1; 430/281.1; 430/306; 430/348; 430/394

(58) Field of Classification Search ..... 430/270.1, 430/273.1, 281.1, 286.1, 302, 306, 409, 434, 430/494, 944, 945; 101/463.1, 453
See application file for complete search history.

(56) References Cited

U.S. PATENT DOCUMENTS

| | | | | | |
|---|---|---|---|---|---|
| 2,760,863 | A | * | 8/1956 | Plambeck, Jr. | 430/306 |
| 3,036,915 | A | * | 5/1962 | Notley | 96/84 |
| 3,218,167 | A | * | 11/1965 | Cohen et al. | 430/281.1 |
| 3,265,765 | A | * | 8/1966 | Holden et al. | 525/271 |
| 3,728,124 | A | * | 4/1973 | Whyte | 430/521 |

(Continued)

FOREIGN PATENT DOCUMENTS

| | | | |
|---|---|---|---|
| CA | 2063296 | | 9/1992 |
| DE | 3015479 | A * | 11/1980 |
| DE | 4006267 | A * | 9/1990 |
| EP | 0 046 028 | A2 * | 2/1982 |
| EP | 507 160 | A * | 8/1982 |

(Continued)

OTHER PUBLICATIONS

Al–Sheikhly, M. et al., "UV, soft x–ray and gamma–ray high resolution imaging and discrimination by a novel photo–polymer film system," Proc. SPIE–Int. Soc. Opt. Eng., 1996, 284–291 (abstract only).*

Aono, T. et al., "The effect of oxygen insulation on the stability of image dyes of a color photographic print and the behavior of alkylhydroquinones as antioxidants," J. Appl. Photogr. Eng., 1982, 8(5), 227–231 (abstract only).*

Ballardini, R. et al., "Quenching of singlet oxygen by hindered amine light stabilizers. A flash photolytic study," Polym. Degrad. Stab. 1984, 7(1), 41–53 (abstract only).*

Busman, S.C. et al., "Peel–apart imaging systems based on photoactivated surfactants," J. Imaging Technol., 1985, 11(4), 191–195 (abstract only).*

(Continued)

*Primary Examiner*—Barbara L. Gilliam
(74) *Attorney, Agent, or Firm*—Carmody & Torrance LLP

(57) ABSTRACT

The present invention provides a method for producing direct-imaged flexographic printing elements such that both the front and back exposure times are economically efficient for the manufacturer. In one embodiment, the method comprises providing at least one solid photocurable element. The solid photocurable element comprises a solid photocurable material comprising an oxygen scavenger, a support layer having an actinic radiation absorbing compound integrated uniformly throughout such that it absorbs at least some actinic radiation during exposure, and a photoablative mask layer. The methods of the invention involve creating a floor in the solid photocurable material by back exposure through the support layer having the actinic radiation absorbing compound, transferring a negative image directly onto the solid photocurable material by photoablating the photoablatable mask layer, followed by front exposure effective to cure the solid photocurable material.

31 Claims, 2 Drawing Sheets

U.S. PATENT DOCUMENTS

| | | | | | |
|---|---|---|---|---|---|
| 3,822,132 | A | * | 7/1974 | Hunter | 430/521 |
| 3,867,153 | A | * | 2/1975 | MacLachlan | 430/5 |
| 3,874,876 | A | * | 4/1975 | Hibino et al. | 430/521 |
| 3,918,976 | A | * | 11/1975 | Arai et al. | 430/521 |
| 3,948,664 | A | * | 4/1976 | Okuyama et al. | 430/521 |
| 4,010,128 | A | * | 3/1977 | Saggese et al. | 524/114 |
| 4,028,113 | A | * | 6/1977 | Sturmer | 430/513 |
| 4,141,736 | A | * | 2/1979 | Canty | 430/271.1 |
| 4,162,919 | A | * | 7/1979 | Richter et al. | 430/271.1 |
| 4,177,074 | A | * | 12/1979 | Proskow | 430/286.1 |
| 4,214,965 | A | * | 7/1980 | Rowe | 522/96 |
| 4,264,705 | A | * | 4/1981 | Allen | 430/271.1 |
| 4,272,608 | A | * | 6/1981 | Proskow | 430/288.1 |
| 4,276,136 | A | * | 6/1981 | Gruber et al. | 522/77 |
| 4,320,188 | A | * | 3/1982 | Heinz et al. | 430/281.1 |
| 4,323,636 | A | * | 4/1982 | Chen | 430/271.1 |
| 4,324,637 | A | * | 4/1982 | Durai-Swamy | 208/403 |
| 4,340,657 | A | * | 7/1982 | Rowe | 430/56 |
| 4,369,246 | A | * | 1/1983 | Chen et al. | 430/306 |
| 4,401,749 | A | * | 8/1983 | Hoffmann et al. | 430/271.1 |
| 4,419,436 | A | * | 12/1983 | Kranser | 430/260 |
| 4,423,135 | A | * | 12/1983 | Chen et al. | 430/271.1 |
| 4,427,759 | A | * | 1/1984 | Gruetzmacher et al. | 430/273.1 |
| 4,447,521 | A | * | 5/1984 | Tiers et al. | 430/337 |
| 4,448,873 | A | * | 5/1984 | Walls et al. | 430/157 |
| 4,459,348 | A | * | 7/1984 | Jun et al. | 430/271.1 |
| 4,460,675 | A | * | 7/1984 | Gruetzmacher et al. | 430/300 |
| 4,564,589 | A | * | 1/1986 | Hallman et al. | 430/524 |
| 4,581,267 | A | * | 4/1986 | Miller | 428/40.6 |
| 4,622,088 | A | * | 11/1986 | Min | 156/244.11 |
| 4,639,411 | A | * | 1/1987 | Daubendiek et al. | 430/510 |
| 4,663,218 | A | * | 5/1987 | Akao | 428/212 |
| 4,824,902 | A | * | 4/1989 | Chen | 524/611 |
| 4,853,471 | A | * | 8/1989 | Rody et al. | 548/261 |
| 4,874,672 | A | * | 10/1989 | Etter et al. | 428/457 |
| 4,877,715 | A | * | 10/1989 | Koch et al. | 430/271.1 |
| 4,892,923 | A | * | 1/1990 | Weaver et al. | 528/190 |
| 4,946,758 | A | * | 8/1990 | Kurtz et al. | 430/259 |
| 4,956,252 | A | * | 9/1990 | Fryd et al. | 430/138 |
| 4,973,702 | A | * | 11/1990 | Rody et al. | 548/261 |
| 4,994,344 | A | * | 2/1991 | Kurtz et al. | 430/273.1 |
| 5,028,518 | A | * | 7/1991 | Lyons et al. | 430/506 |
| 5,032,498 | A | * | 7/1991 | Rody et al. | 430/512 |
| 5,049,646 | A | * | 9/1991 | Tyagi et al. | 528/272 |
| 5,055,377 | A | * | 10/1991 | Littmann et al. | 430/271.1 |
| 5,055,513 | A | * | 10/1991 | Banford et al. | 524/433 |
| 5,063,132 | A | * | 11/1991 | Pierce et al. | 430/109.4 |
| 5,075,192 | A | * | 12/1991 | Fryd et al. | 430/138 |
| 5,102,762 | A | * | 4/1992 | Tyagi et al. | 430/109.4 |
| 5,135,827 | A | * | 8/1992 | Bohm et al. | 430/30 |
| 5,198,321 | A | * | 3/1993 | Hosoi et al. | 430/138 |
| 5,215,876 | A | * | 6/1993 | Pruett et al. | 430/512 |
| 5,223,375 | A | * | 6/1993 | Berrier et al. | 430/281.1 |
| 5,262,275 | A | * | 11/1993 | Fan | 430/273.1 |
| 5,264,325 | A | * | 11/1993 | Allen et al. | 430/280.1 |
| 5,432,035 | A | * | 7/1995 | Katagiri et al. | 430/108.2 |
| 5,496,685 | A | * | 3/1996 | Farber et al. | 430/306 |
| 5,543,262 | A | * | 8/1996 | Sypek et al. | 430/162 |
| 5,585,422 | A | * | 12/1996 | Falk et al. | 524/100 |
| 5,846,691 | A | * | 12/1998 | Cusdin et al. | 430/300 |
| 5,851,746 | A | * | 12/1998 | Rieger et al. | 430/510 |
| 5,925,500 | A | * | 7/1999 | Yang et al. | 430/300 |
| 5,989,794 | A | * | 11/1999 | Marien | 430/512 |
| 5,994,032 | A | * | 11/1999 | Goffing et al. | 430/307 |
| 6,020,108 | A | * | 2/2000 | Goffing et al. | 430/306 |
| 6,171,758 | B1 | | 1/2001 | Bhateja et al. | |
| 6,194,125 | B1 | | 2/2001 | Goffing et al. | |
| 6,235,454 | B1 | * | 5/2001 | Burberry et al. | 430/346 |
| 6,308,628 | B1 | * | 10/2001 | Bronstein et al. | 101/467 |
| 6,352,815 | B1 | * | 3/2002 | Feil et al. | 430/306 |
| 2001/0053499 | A1 | * | 12/2001 | Yang et al. | 430/300 |
| 2002/0009672 | A1 | | 1/2002 | Daems et al. | |
| 2002/0009673 | A1 | * | 1/2002 | Yang et al. | 430/306 |
| 2002/0018963 | A1 | * | 2/2002 | Yang et al. | 430/273.1 |

FOREIGN PATENT DOCUMENTS

| | | | | |
|---|---|---|---|---|
| EP | 121 403 | A | * | 10/1984 |
| EP | 057 160 | B | * | 6/1985 |
| EP | 157639 | A2 | * | 10/1985 |
| EP | 182 617 | A2 | * | 5/1986 |
| EP | 196 561 | A1 | * | 10/1986 |
| EP | 748 700 | A1 | * | 12/1986 |
| EP | 209 803 | A2 | * | 1/1987 |
| EP | 231 112 | A2 | * | 8/1987 |
| EP | 231 953 | A2 | * | 8/1987 |
| EP | 294 056 | A2 | * | 12/1988 |
| EP | 319 296 | A2 | * | 6/1989 |
| EP | 322 556 | A1 | * | 7/1989 |
| EP | 327 763 | A2 | * | 8/1989 |
| EP | 386 780 | A2 | * | 9/1990 |
| EP | 456 336 | A2 | * | 11/1991 |
| EP | 478 263 | A1 | * | 4/1992 |
| EP | 500 372 | A1 | * | 8/1992 |
| EP | 504 824 | B1 | * | 9/1992 |
| EP | 509 514 | A1 | * | 10/1992 |
| EP | 524 654 | A1 | * | 1/1993 |
| EP | 542 286 | A1 | * | 5/1993 |
| EP | 603 556 | A2 | * | 6/1994 |
| EP | 631 177 | A1 | * | 12/1994 |
| EP | 640 878 | A1 | * | 3/1995 |
| EP | 677 397 | A1 | * | 10/1995 |
| EP | 715 965 | A1 | * | 6/1996 |
| EP | 724 181 | A2 | * | 7/1996 |
| EP | 751 422 | A1 | * | 1/1997 |
| EP | 767 211 | A1 | * | 4/1997 |
| EP | 786 689 | A1 | * | 7/1997 |
| GB | 1366769 | | * | 9/1974 |
| GB | 1588903 | | * | 4/1981 |
| GB | 2083239 | A | * | 3/1982 |
| GB | 2083240 | A | * | 3/1982 |
| GB | 2229726 | A | * | 10/1990 |
| JP | 58-220139 | A | * | 12/1983 |
| JP | 60-228149 | A | * | 11/1985 |
| JP | 63-135935 | A | * | 6/1988 |
| JP | 63-237951 | A | * | 10/1988 |
| JP | 01-042645 | A | * | 2/1989 |
| JP | 03-223384 | A | * | 10/1991 |
| JP | 5-094015 | | | 4/1993 |
| JP | 05-094015 | A | * | 4/1993 |
| JP | 06-065478 | A | * | 3/1994 |
| JP | 07-076185 | A | * | 3/1995 |
| JP | 07-258520 | A | * | 10/1995 |
| JP | 9-171247 | | | 6/1997 |
| JP | 10-148930 | | | 2/1998 |
| JP | 10-509529 | | | 9/1998 |
| WO | WO 88/08788 | | * | 11/1988 |
| WO | WO 93/05443 | | * | 3/1993 |
| WO | WO 93/05444 | | * | 3/1993 |
| WO | WO96/14603 | | | 5/1996 |
| WO | WO 97/00777 | | * | 1/1997 |
| WO | WO 88/04794 | | * | 6/1998 |
| WO | WO 01/27696 | A1 | * | 4/2001 |

OTHER PUBLICATIONS

Chu, N.Y.C., "Innovative concepts for the solar building program evaluation of photochromic plastics: final report, Oct. 1987–Sep. 1988," Energy Res. Abstr., 1989, 14(10), Abstract No. 20059 (abstract only).*

Ebisu, K. et al., "Flash fusible color toner color laser printers," Fujitsu Sci. Tech. J., 1992, 28(3), 335–346 (abstract only).*

Laver, H., "The use of UV–absorbers in x–ray photographic films," REs. Discl., 1984, 248, 598 (abstract only).*
Niino, H. et al., "Surface reaction of organic materials by laser ablation of matrix–isolated photoreactive aromatic azido compound," J.Photochem. Photobiol., A, 1997, 106, 9–13 (abstract only).*
Otero, T.F. et al., "In situ absorption–reflection study of polypyrrole composites–switching stability," Electrochim. Acta, 1996, 41(11/12f), 1871–1876 (abstract only).*
Schiller, P.R., "NDC: boosting polyester performance," Spec. Polyesters '95 Proc., 1995, 319–327 (abstract only).*

Morgan, C.R., et al., "UV generated oxygen scavengers and method for determining their effectiveness in photopolymerizable systems," *J. Radiation Curing,* Oct. 1983, 4–7.*

* cited by examiner

UV-ABSORBING SUPPORT LAYERS AND FLEXOGRAPHIC PRINTING ELEMENTS COMPRISING SAME

Matter enclosed in heavy brackets [ ] appears in the original patent but forms no part of this reissue specification; matter printed in italics indicates the additions made by reissue.

FIELD OF THE INVENTION

The present invention is directed to flexographic printing elements having light-attenuating support layers, to the formation of relief images on direct-image flexographic printing elements and, more particularly, to methods for achieving a uniform floor in the manufacture of such direct-image flexographic printing elements.

BACKGROUND OF THE INVENTION

Relief image printing plates are used in both flexographic and letterpress processes for printing on a variety of substrates, including paper, corrugated stock, film, foil, and laminates. Relief elements typically include a support layer and one or more layers of photocurable polymer in the form of solid sheets. The printer typically peels a cover sheet from the element to expose the photocurable polymer and places a silver halide photographic negative or some other masking device upon the photopolymer. The printer exposes the negative-bearing element to ultraviolet (UV) light through the negative, thereby causing exposed areas of the element to harden, or cure. After the uncured areas of the element are removed, cured polymer remains as the relief printing surface.

The negatives used in such processes typically are costly items, and the time required for their preparation can be considerable, particularly in those print shops that are not capable of preparing negatives in-house. Moreover, any negative which is used for printing must be nearly perfect. Even minor flaws will be carried through onto each printed item. As a consequence, effort must be expended to ensure that the negative is precisely made. In addition, the negative is usually made with silver halide compounds which are costly and which are also the source of environmental concerns upon disposal.

In the art of flexographic printing, processes have been developed to eliminate the use of the negative, thereby offering significant advantages over previous methods such as, for example, cost efficiency, environmental impact, convenience, and image quality. Many such processes are referred to as direct-to-plate (DTP) processes. One DTP process is disclosed in U.S. Pat. No. 5,846,691 to Cusdin, et al., herein incorporated by reference, which describes formation of a computer-generated negative on a photosensitive printing element by ejecting a negative-forming ink from an ink jet print head directly onto the surface of the printing element. Another such process is disclosed in U.S. Pat. No. 5,925,500 to Yang, et al., herein incorporated by reference, which describes a method of making a laser-imaged printing plate by modifying the slip film with a UV absorber and employing a laser to selectively ablate the slip film. In such methods, the slip film, in effect, becomes the negative as only the areas of the photopolymer to be cured are exposed to actinic radiation. Yet another DTP process is disclosed in U.S. Pat. No. 5,262,275 to Fan, herein incorporated by reference, in which a layer of laser-ablatable infrared radiation sensitive material is disposed upon the surface of the printing element.

DTP technology is significantly different than the conventional plate making technology in a number of respects. DTP plates, for example, typically have a photoablative mask directly on the plate. Also, in DTP technology, face exposure, i.e., a blanket exposure to actinic radiation of the photopolymerizable layer on the side that does (or, ultimately will) bear the relief, is done in air (in the presence of oxygen), whereas, with conventional plates, exposure is typically done in vacuum.

Because face exposure is conducted in the presence of oxygen, there is the potential for excessive exposure of the photocurable layer to oxygen in areas where the masking layer has been removed. This can present problems because the photopolymerization kinetics of many materials in the presence of oxygen are very different from those observed in the absence of oxygen because oxygen is a known free radical scavenger. Hence, oxygen has the effect of inhibiting polymerization of the photocurable material, thus requiring longer exposure times. In addition, oxygen could potentially act as a UV screening agent, resulting in attenuation of the actinic radiation. Generally, this phenomenon is referred to as "oxygen inhibition."

Oxygen inhibition is typically compounded when so-called "capped" photocurable printing elements are used. Capped photocurable elements have a thin photocurable cap disposed upon the main body of the photocurable material. Typically, with such elements, the relief image formed includes photocurable material from the cap layer. Capped printing elements typically have several significant advantages over uncapped elements in DTP processes. For example, the cap typically has a rough surface that can act as an ink receptive layer, resulting in higher ink densities on the printed substrate. Also, capped plates, because of their longer exposure times, typically enable the user to modify dot shape, resulting in smaller, but more robust dots. The cap layer can also include an image contrast (e.g. green) dye which aids in the inspection of the registered image. The cap itself, however, due to the presence of the dye (and other components), acts as an actinic radiation absorbing layer. Thus, the phenomenon of oxygen inhibition is amplified when imagining capped photocurable printing elements to the extent that relatively long front exposures may be required to hold fine detail dots (i.e., 1% dots on a 150 line).

To decrease front exposure times when processing printing elements with DTP technology such that such times are comparable to those of conventional printing elements, the photo speed (i.e., the speed of photopolymerization) typically is increased to counter the effects of oxygen inhibition. One way to do this is to incorporate oxygen scavengers such as, for example, triphenylphosphine and triphenylphosphite, into the polymer formulation. The addition of oxygen scavengers to the polymer formulation, however, not only decreases the front exposure time, but, also decreases the back exposure time as well.

As used herein, "back exposure" is a blanket exposure to actinic radiation of the photopolymerizable layer on the side opposite that which does (or, ultimately will) bear the relief. This is typically done through a transparent support layer. Such exposure is used to create a shallow layer of polymerized material, herein referred to as a "floor," on the support side of the photopolymerizable layer. The purpose of the floor is generally to sensitize the photopolymerizable layer and to establish the depth of the relief. Typically, it is desired to have back exposure times greater than 15-30 seconds. In DTP technology, however, increasing the photo speed as described above often results in a back exposure time of less than 30 seconds. Such short back exposure times are undesirable because, for reasons discussed in detail below, variations in the thickness of the floor are typically observed. In turn, a non-uniform floor typically contributes to uneven printing due to variation in the relief across the plate.

Back exposure times can be increased in DTP systems by applying a thin, i.e., 1-2 microns, coating of a UV-absorbing compound between the photopolymerizable layer and the support, or backing, layer. This approach, however, is problematic, as it is difficult to apply the UV-absorbing coating uniformly. This, of course, also creates variations in the thickness of the floor. Also, the coating could interact with the laser and create problems of adhesion.

Accordingly, there is a need in the art for an improved method to produce direct-imaged capped and uncapped flexographic printing plates.

BRIEF DESCRIPTION OF THE INVENTION

The present invention provides methods for producing direct-imaged flexographic printing elements such that both the front and back exposure times are economically efficient for the manufacturer. The present invention provides a solid photocurable element that comprises a layer of solid photocurable material containing an oxygen scavenger disposed on a support layer. The support layer has an actinic radiation absorbing compound integrated uniformly throughout such that it absorbs at least some actinic radiation during exposure. The solid photocurable element also comprises a photoablative mask layer disposed on the solid photocurable layer. The mask is substantially opaque to actinic radiation and is capable of being photoablated by a laser.

The methods of the present invention comprise transferring graphic data from a computer to the solid photocurable element described above by photoablating selected areas of the photoablatable mask layer using a laser that is in communication with the computer, thus providing ablated and unablated areas forming an image. The ablated areas expose the solid photocurable layer which ultimately becomes the relief. A "floor" is also established by exposing the photocurable layer through the support layer. The solid photocurable material that is exposed through the ablated areas of the photoablatable mask layer are then exposed to actinic radiation effective to cure the solid photocurable material and leave solid photocurable element underneath the unablated areas uncured. The uncured solid photocurable material and the unablated areas of said photoablatable mask layer are then removed.

In another embodiment of the present invention, the solid photocurable printing element further comprises a solid photopolymerizable cap layer. In this embodiment the photoablative mask layer is disposed directly onto the cap layer and the method is performed accordingly.

BRIEF DESCRIPTION OF THE DRAWINGS

The numerous objects and advantages of the present invention may be better understood by those skilled in the art by reference to the accompanying non-scale figures, in which.

DETAILED DESCRIPTION OF THE INVENTION

As used herein, the term "photocurable material" refers to a solid composition which undergoes polymerization, cross-linking, or any other curing or hardening reaction in response to actinic radiation with the result that the unexposed portions of the material can be selectively separated and removed from the exposed (cured) portions to form a three dimensional or relief pattern of cured material.

The separation and removal of the unexposed portions can be accomplished using a jet of air ("air knife"), brushing, selective solubilization or dispersion in a suitable developer solvent or detergent solution, a squeegee, a combination of the foregoing, or other suitable development means.

Figure 1:
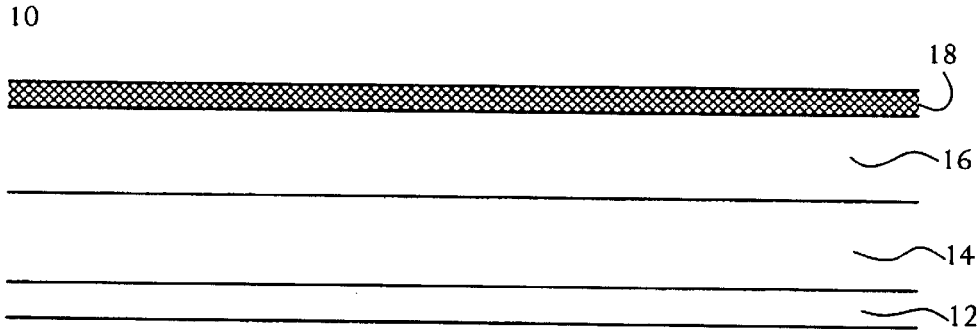
FIG. 1 is a cross-sectional view of a printing element according to the invention.
Figure 2:
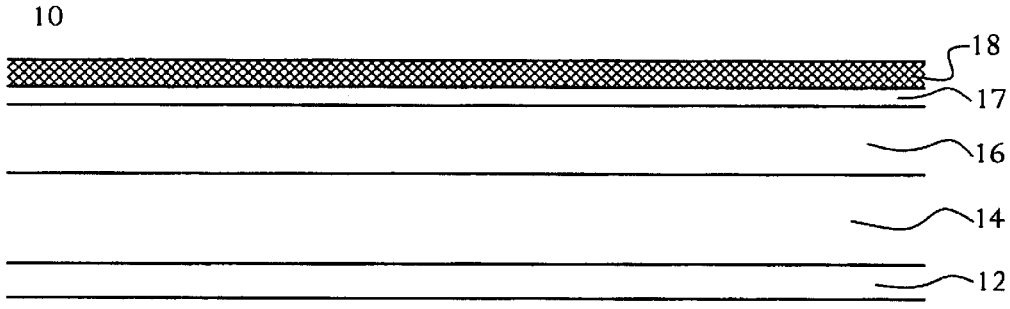
FIG. 2 is a cross-sectional view of another embodiment of a printing element according to the invention.

As shown in FIGS. 1 and 2 wherein like elements have like numerals, a preferred photocurable element 10 to be used in a DTP imaging process comprises a support layer 12, at least one photocurable layer 14, an optional second photocurable layer 16, and a photoablatable mask layer 18. The preferred photocurable element can also comprise a "cap" layer 17 (shown in FIG. 2). The photocurable elements 10 shown in FIGS. 1 and 2 can also comprise an adhesive layer between photocurable layer 14 and the support layer 12 (not shown). The photocurable elements according to the present invention preferably are substantially planar solid elements having a thickness of at least about 0.067 inches.

Typically, in DTP technology, the cover-sheet (not shown) is removed, thus exposing the photoablatable mask layer. A computer then transfers digital information to the photoablative mask layer via a laser that is in communication with the computer that ablates those areas of the photoablative mask layer that have to cure, i.e., those areas that ultimately become the relief layer. The plate is then back-exposed to build the floor, face exposed through the in-situ mask, and processed in a solvent processor. The area of the mask that was not ablated prevents the underlying photopolymer to cure and is removed during the processing step. That area where the mask was removed is cured and becomes the relief area. The plate is then dried and post-exposed and de-tacked as usual.

The photocurable layer 14,16 of the photocurable element can include any of the known photopolymers, monomers, initiators, reactive diluents, filters, and dyes. Preferred photocurable materials include an elastomeric compound, an ethylenically unsaturated compound having at least one terminal ethylene group, and a photoinitiator. Exemplary photocurable materials are disclosed in European Patent Applications 0 456 336 A2 (Goss, et al.), and 0 640 878 A1 (Goss, et al.), British Patent No. 1,366,769, U.S. Pat. No. 5,223,375 (Berrier, et al.), U.S. Pat. No. 3,867,153 (MacLahan), U.S. Pat. No. 4,264,705 (Allen), U.S. Pat. No. 4,323,636 (Chen, et al.), U.S. Pat. No. 4,323,637 (Chen, et al.), U.S. Pat. No. 4,369,246 (Chen, et al.), U.S. Pat. No. 4,423,135 (Chen, et al.), U.S. Pat. No. 3,265,765 (Holden, et al.), U.S. Pat. No. 4,320,188 (Heinz, et al.), U.S. Pat. No. 4,427,759 (Gruetzrnacher, et al.), U.S. Pat. No. 4,622,088 (Min), and U.S. Pat. No. 5,135,827 (Bohm, et al.), which are incorporated herein by reference.

"Cap" layer 16 generally comprises photocurable material which is the same as or similar to the photocurable material present in the photocurable layer. Suitable compositions for the cap layer are those disclosed as elastomeric compositions in the multilayer cover element described in U.S. Pat. Nos. 4,427,759 and 4,460,675 (Gruetzmacher, et al.), both of which are incorporated herein by reference. Additional components present in the cap layer include: a coating solvent, optionally but preferably a non-migrating dye or pigment which provides a contrasting color with any colorant or dye present in the photocurable layer. Optionally, cap layer 16 can also include one or more ethylenically unsaturated monomeric compounds, and/or a photoinitiator or initiator system. The contrast dye can be Acid Blue 92, or other dyes disclosed in, for example, U.S. Pat. No. 3,218,167, incorporated herein by reference. In general, the thickness of the cap is in the range of from about 0.00001 to 0.003 inches. Preferably, the thickness of the cap is from about 0.000015 to about 0.0025 inches. An example of a capped photopolymer element as described is FLEXLIGHT EPIC® (commercially available from Polyfibron Technologies, Inc., Atlanta, Ga.).

The photocurable materials of the invention should cross-link (cure) and, thereby, harden in at least some actinic wavelength region. As used herein, actinic radiation is radiation capable of effecting a chemical change in an exposed moiety. Actinic radiation includes, for example, amplified (e.g., laser) and non-amplified light, particularly in the UV and infrared wavelength regions. Preferred actinic wavelength regions are from about 250 nm to about 450 nm, more preferably from about 300 nm to about 400 nm, even more preferably from about 320 nm to about 380 nm.

As described above, longer front exposure times are typically required for the transfer of fme detail images onto the photocurable element due to the presence of oxygen in DTP technology. Thus, it is preferable to include, for example, oxygen scavengers into the photocurable material to counter the effects of the oxygen, thereby decreasing the exposure time (i.e., increasing the photospeed of the photopolymer).

Preferably, the oxygen scavenger is a phosphine compound. Representative phosphine compounds include triphenylphosphine, tri-p-tolylphosphine, diphenylmethylphosphine, diphenylkethylphosphine, diphenylpropylphosphine, dimethylphenylphosphine, diethylphenylphosphine, dipropylphenylphosphine, divinylphenylphosphine, divinyl-p-methoxyphenylphosphine, divinyl-p-bromophenylphosphine, divinyl-p-tolylphosphine, diallyphenylphosphine, diallyl-p-methoxyphenylphosphine, diallyl-p-bromophenylphosphine and diallyl-p-tolylphosphine. Triphenylphosphine is particularly preferred.

Preferably, the phosphine compound is present in the solid photocurable compound at from about 0.01 to about 2.0 weight percent of the solid photocurable material, more preferably from about 0.05 to about 1.0 weight percent of the solid photocurable material, and most preferably from about 0.075 to about 0.75 weight percent of the solid photocurable material.

Additional ways to decrease the exposure times include increasing the intensity of the actinic radiation. High intensity lamps, however, typically generate excessive heat which can create problems such as plate warping and image deterioration.

By employing any of these methods for decreasing the front exposure time, the back exposure time required to build a floor of a particular thickness also should decrease. For example, in a conventional flexographic printing element manufacturing process (i.e., in a vacuum and without oxygen), a 0.067 inch element will have a floor thickness of about 0.029 inches. The back exposure time required to build a floor of this thickness is typically about 15-60 seconds. For the same element processed with conventional DTP technology (i.e., ablation in the presence of oxygen and where the photocurable element is doped with oxygen scavengers), the back exposure time required to build a floor of the same thickness is typically about 1 to 5 seconds.

Forming a uniform floor with a back exposure time of less than about 15 to 20 seconds is often very difficult primarily because the fluorescent lamps that are used typically have a significant variation in intensity across the bank of lights, and often have a significant variation in intensity across any given light in the bank due to variations in the filament. This non-uniformity in the actinic radiation intensity translates directly to nonumiformity of the floor build-up during back exposure. If the back exposure times are too short, as observed with plates processed with conventional DTP technology, this problem is more severe. If the times are longer then the problem is less pronounced. A non-uniform floor build-up results in non-uniform printing because printing presses typically are adjusted for a certain relief. Those areas having shallower relief will print bold. Those having deeper relief may print with poor quality and distortion. As described herein, a modification to the support, or backing, layer, will allow printers to better control floor-formation in DTP technology.

The support layer 12 of the photocurable element is preferably formed from a variety of flexible, transparent materials. Examples of such materials are cellulose films, or plastics such as, for example, PET (polyetheylene terephthalate), PEN (polyethylene naphthalate), polyether, polyethylene, polyamide (Kevlar) or nylon. Preferably, the support layer is formed from polyethylene terephthalate (PET). The support layer can be from about 0.001 to about 0.010 inches thick. Preferably, the support layer is about 0.005 inches thick. More preferably, if the support layer is a polyester film such as, for example, PET, the support layer is typically about 0.005" for 0.067" and thicker plates.

According to the present invention, the support layer 12 is UV-absorbing to counter the increased photo-speed that results from the use of oxygen scavengers or other means used to counter the effects of oxygen inhibition in DTP technology. As described in detail below, this can be accomplished either by forming the support layer 12 from a material that is inherently UV-absorbing, i.e., attenuates actinic radiation itself, or by adding a dopant to the material forming the support layer 12.

In one embodiment of the present invention, the support layer 12 is formed from a material that is inherently UV-absorbing. Of the above-mentioned materials that are preferably used to form the support layer, only PEN (for example, Kaladex 1030 and Kaladex 2000 commercially available from DuPont PET, Hopewell, Va.) is inherently UV absorbing. The inventors have found that, when an inherently UV-absorbing support layer is used, the percent of actinic radiation that is absorbed is a function of the thickness of the support layer. The inventor has found that, for example, a PEN support layer having a thickness of about 5 mils absorbs about 97 percent of actinic radiation; a PEN support layer having a thickness of about 3 mils absorbs about 95 percent of actinic radiation.

According to another embodiment of the present invention, the support layer 12 comprises a UV-absorbing material to counter the increased photo-speed that results from the use of oxygen scavengers or other means to counter the effects of oxygen inhibition in DTP technology. This can be accomplished by adding a UV-absorbing dopant to the support layer during manufacture.

Transparent materials that are not inherently UV-absorbing need to be doped with a UV-absorber when made into the support layer 12 according to the present invention. The UV-absorbing dopant should be uniformly distributed throughout the support layer 12. This can be accomplished if, for example, the UV-absorbing material is soluble in the support layer or evenly dispersed throughout during the process of manufacturing the support layer 12. As used herein, the term "soluble" refers to the capability of one compound of being dissolved. The term "dispersed" refers to one substance being evenly distributed throughout another. In commercial processes, a uniform distribution of the dopant throughout the support layer 12 is typically achieved during the manufacturing process as the PET, for example, is stretched both in the transverse and machine directions so that the UV absorber is distributed uniformly throughout the PET.

The commercially available UV absorbing PET products known to the inventor are Melinex 943 (DuPont PET, Hopewell, Va.), Skyrol Polyester Type TU84B (SKC LTD, Suwon, S. Korea), Teijin Teonex Type Q51 (Teijin, Japan), and Eastman PET 9921 G0071 (Eastman Chemicals, Kingsport, Tenn.).

The spectral range of the flood-exposure lamps used in most applications is about 300-400 nm. Therefore the UV absorbing dopant typically should be active in this range.

Preferably, the presence of the UV absorber changes a normally UV transparent support layer into an attenuation tool that absorbs at least a portion of UV radiation that passes through it. Preferably, the support absorbs between about 80 to about 99%, more preferably between about 85 to about 95%, and most preferably about 88% of actinic radiation.

The intensity of flood exposure lamps used in the curing of flexographic printing plates is typically in the range of about 5-25 milliwatts/cm$^2$, but intensities can be as high as 50 milliwatts/cm$^2$. Therefore, the support layer should be capable of absorbing irradiated light of such intensities from the UV flood lamps.

The photoablative mask layer 18 can be any photoablative mask layer known in the art. Such mask layers include those that can be ablated by any type of laser known to those skilled in the art such as, for example, UV-type Eximer lasers typically operating at wavelengths of about 300 to 400 nm; IR-type lasers such as, for example, $CO_2$ lasers typically operating at a wavelength of about 10,640 nm; Nd-YAG lasers typically operating at a wavelength of about 1064 nm; and diode array lasers typically operating at a wavelength of about 830 nm. Examples of such photoablative mask layers are disclosed in, for example, U.S. Pat. No. 5,925,500 to Yang, et al., herein incorporated by reference, which discloses slip films modified with a UV absorber as the mask layer, thus employing a laser to selectively ablate the modified slip film; and U.S. Pat. No. 5,262,275 to Fan, herein incorporated by reference.

Generally, the methods of the invention involve transferring an image to the surface of the photocurable elements 10 without the use of phototools or photomasks such that both the front and back exposure times are economically efficient for the manufacturer of a printing plate. This typically is accomplished by providing at least one solid photocurable element 10. The solid photocurable element comprises at least one solid photocurable material 14,16, a solid photopolymerizable cap layer 17 (if applicable), a photoablative mask layer 18, and a support layer 12 having an actinic radiation absorbing compound integrated uniformly throughout such that it absorbs at least some actinic radiation during exposure. According to the present invention, the photocurable layers 14, 16 and also the cap layer (if used) contain oxygen scavengers to counter the longer exposure times that occur as a result of oxygen inhibition.

When the solid photocurable printing element is to be used, a laser is employed to selectively ablate, or remove, the photoablative mask layer such that the areas where the photoablative mask layer was ablated will cure, or harden, upon exposure to the UV light and the areas where the photoablative mask layer was not ablated will remain uncured. A floor is created in the solid photocurable material by back exposure through the UV-absorber-doped support layer. The uncured plate is then front-exposed to UV light in the usual fashion effective to cure the solid photocurable material. There are many devices that can be used to perform this so-called "front" exposure of the photocurable elements, including FLEXLIGHT® brand UV modules (Polyfibron Technologies, Inc.), as well as those manufactured by Anderson & Vreeland (Bryan, Ohio).

Following front exposure of the exposed areas of the photopolymer, uncured photopolymer, i e., the photopolymer under the areas of the photoablative layer that were not laser-ablated, is removed from the mounted photocurable elements, typically by washing the elements with (and/or in) an organic and/or aqueous solvent in which the photocurable material is at least somewhat soluble. This solvent wash step typically is accompanied or preceded by brushing, wiping, or some other mild, non-destructive abrasion of the elements. Useful washing devices include those commercially available from Polyfibron Technologies and Anderson & Vreeland.

Additional objects, advantages, and novel features of this invention will become apparent to those skilled in the art upon examination of the following examples thereof, which are not intended to be limiting.

EXAMPLES

Example 1

Preparation of an Uncapped Flexo DTP Plate

A Flex-Light Atlas 0.067" plate (Polyfibron Technologies, Inc., Atlanta, Ga.) was modified in the following way: The slip film was carefully removed using isopropanol. The plate was then dried and then laminated with a carbon black (CB) based mask. The CB mask comprised of a) CB pigment, b) a binder for its film forming property and c) a self-oxidizing binder to increase sensitivity to ablation.

After lamination, the coversheet was removed and discarded. The plate was mounted on a commercially available flexo plate-setter such as Misomex's OmniSetter 4000 or Creo's Thermoflex 5280. The digital file from the computer was transferred onto the CB mask through an ablative mechanism. The plate was then back exposed for 17 seconds, face exposed for 18 minutes to hold 1% dots at 133 LPI. The face-exposure time of 18 minutes was deemed to be too long for an uncapped DTP plate.

Example 2

Preparation of an Uncapped Flexo DTP Plate with Lower Face-Exposure Times

A FLEX-LIGHT ATLAS® 0.067 inch plate was doped with 0.1% triphenylphosphine. Plate construction for DTP application was same as in Example 1. However, the following back exposure and face exposure times had to be used to hold the same level of detail:

Back Exposure: 3 to 5 seconds

Face Exposure: 5 minutes

Although,the face exposure times were acceptable, the back exposure time was deemed too short for a 0.067" flexo plate. Floor build-up was found uneven with such short exposure times.

Example 3

Construction of an Uncapped Flexo DTP Plate Using Polyethylenenaphthalate Backing The doped FLEX-LIGHT ATLAS® 0.067 inch plate of example 2 was next constructed with polyethylene naphthalate (PEN), an inherently UV absorbing backing material as the UV-absorbing backing layer. The PEN was 5 mil Kaladex 1030 commercially available from DuPont PET (Hopewell, Va.). The rest of the plate construction, laser imaging, and plate processing conditions were identical to the plate used in Example 2. In this example, the UV absorbing backing allowed reasonable back exposure times. The back exposure was now 120 seconds. The face exposure was still 5 minutes. The floor of this plate was very even. Although the back exposure times were acceptable for an uncapped DTP, it was desired to achieve back exposure times normally used for 067 plates, around 15-30 seconds. This was accomplished as described in the next example.

Example 4

Final Construction of an Uncapped Flexo DTP Plate.

The doped FLEX-LIGHT ATLAS® 0.067 inch plate of example 2 was next constructed with a UV absorbing PET commercially available from DuPont Polyester (Hopewell, Va.). The UV-absorbing PET was 500 gage Melinex 943. The rest of the plate construction, laser imaging, and plate processing conditions were identical to the plate used in Example 2. However, in this case the UV absorbing PET allowed reasonable back exposure times. The back exposure was now 20-22 seconds. The face exposure was still 5 minutes. The floor of this plate was very even. Thus, the times were acceptable for an uncapped DTP.

Example 5

Preparation of a Capped Flexo DTP Plate

The slip film of a Flexlgiht EPIC 0.067" plate (Polyfibron Technologies, Inc., Atlanta, Ga.) was carefully removed leaving the green cap on the photopolymer base. A carbon black based mask on a coversheet was then laminated onto the dried plate so that the cap was now in intimate contact with the mask. The coversheet was removed and discarded. The plate was mounted on a commercially available flexo plate-setter such as Misomex's OmniSetter 4000 or Creo's Thermoflex 5280 and laser imaged. The laser removed the mask in selective regions. Hence, the digital file from the computer was transferred onto the CB mask through an ablative mechanism.

The plate was then back-exposed for 20 seconds, face exposed for 60 minutes to hold 1% dots at 133 LPI. The face exposure time of 60 minutes was deemed too long for a capped plate.

Example 6

Preparation of a Capped Flexo DTP Plate with Lower Face-Exposure Times

The Flexlgiht EPIC 0.067" plate of example 5 (both the photo-polymer as well as the cap) was doped with 0.1% triphenylphosphine (TPP), a known oxygen scavenger. It was necessary to keep the same level of TPP in both the cap as well as the underlying photopolymer.

The "doped" photopolymer was extruded onto the "doped" cap. The CB mask was laminated on the green cap. The rest of the imaging and processing steps were as described in Example 5. Here, however, the exposure times were dramatically different as shown below:

Back exposure: 3 to 5 seconds

Face exposure: 15 minutes

The above exposure, times were required to hold the same level of detail and a similar floor thickness as the plate from Example 5. Although now the face exposure was deemed acceptable for a capped plate, the back exposure resulted in uneven floor thickness. Thus, the back exposure times were too short to get a consistent floor.

Example 7

Final Construction of a Capped DTP Flexo Plate

As seen from Example 6, the capped DTP flexo plate met all possible requirements except for the back exposure time, which was too short. To increase the back exposure times it was necessary to use a UV absorbing PET commercially available from DuPont PET called Melinex 943 (500 gage). The rest of the capped plate construction, i.e., the "doped" photopolymer, the "doped" cap, and the CB mask, was identical to the plate from Example 6. The laser imaging and subsequent processing steps (except for the BEX time) were also identical. The UV absorbing PET yielded a reasonable back exposure of 20-25 seconds. The face exposure was still 15 minutes. The floor of the plate was very consistent. Thus, the exposure times and all process conditions were acceptable for a capped DTP plate.

Those skilled in the art will appeciate that numerous changes and modifications may be made to the preferred embodiments of the invention and that such changes and modifications may be made without departing from the spirit of the invention. It is therefore intended that the appended claims cover all such equivalent variations as fall within the true spirit and scope of the invention.

What is claimed is:

1. A method comprising:

a) providing at least one solid photocurable printing element comprising:

a support layer having an actinic radiation absorbing compound uniformly distributed throughout said support layer;

a layer of solid photocurable material that has first and second opposing major faces, said first opposing major face disposed upon said support layer, wherein said layer of solid photocurable material comprises an oxygen scavenger; and a photoablative mask layer that is disposed on said second opposing major face, that is substantially opaque to actinic radiation, and is capable of being photoablated by a laser;

b) transferring graphic data to said solid photocurable printing element by photoablating said photoablative mask layer with a laser, thereby providing ablated and unablated areas forming an image, said ablated areas exposing said second opposing major face of said solid photocurable layer;

c) exposing said first opposing major face of said photocurable layer through said support layer;

d) exposing said ablated areas of said solid photocurable material to actinic radiation effective to cure said solid photocurable material; and e) removing uncured photocurable material and said unablated areas of said photoablative mask layer from said element.

2. A method according to claim 1 wherein said support layer is polyethylene terephthalate.

3. A method according to claim 1 wherein said support layer having an actinic radiation absorbing compound uniformly distributed throughout said support layer absorbs between about 85 and about 95 percent actinic radiation.

4. A method according to claim 1 wherein said oxygen scavenger comprises a phosphine compound.

5. A method according to claim 4 wherein said phosphine compound is selected from the group consisting of triphenylphosphine, triphenyl phosphite, tri-p-tolylphosphine, diphenylmethylphosphine, diphenylethylphosphine, diphenylpropylphosphine, dimethylphenylphosphine, diethylphenylphosphine, dipropylphenylphosphine, divinylphenylphosphine, divinyl-p-methoxyphenylphosphine, divinyl-p-bromophenylphosphine, divinyl-p-tolylphosphine, diallylphenylphosphine, diallyl-p-methoxyphenylphosphine, diallyl-p-bromophenylphosphine and diallyl-p-tolylphosphine.

6. A method according to claim 4 wherein said phosphine compound is present at a concentration of from about 0.075 to about 0.75 weight percent of said solid photocurable material.

7. A method according to claim 1 wherein said solid photocurable material comprises a plurality of layers.

8. A method according to claim 1 wherein said solid photocurable element further comprises a cap layer upon which said photoablative mask layer is disposed.

9. A method according to claim 8 wherein said cap layer comprises an actinic radiation absorbing dye.

10. A method comprising:

a) providing at least one solid photocurable printing element comprising:
   an inherently UV-absorbing support layer;
   a layer of solid photocurable material that has first and second opposing major faces, said first opposing major face disposed upon said support layer, wherein said layer of solid photocurable material comprises an oxygen scavenger; and
   a photoablative mask layer that is disposed on said second opposing major face, that is substantially opaque to actinic radiation, and is capable of being photoablated by a laser;

b) transferring graphic data to said solid photocurable printing element by photoablating said photoablative mask layer with a laser, thereby providing abalted and unablated areas forming an image, said ablated areas exposing said second opposing major face of said solid photocurable layer;

c) exposing said first opposing major face of said photocurable layer through said support layer;

d) exposing said ablated areas of said solid photocurable material to actinic radiation effective to cure said solid photocurable material; and e) removing uncured photocurable material and said unablated areas of said photoablative mask layer from said element.

11. A method according to claim 10 wherein the support layer is polyethylene naphthalate.

12. A printing element according to claim 11 wherein the polyethylene naphthalate support layer is from about 3 to 5 mils thick.

*13. A method for producing a flexographic printing plate, said method comprising:*

*a) providing at least one solid photocurable printing element comprising:*
   *(i) a support layer having an actinic radiation absorbing compound uniformly distributed throughout said support layer;*
   *(ii) a layer of solid photocurable material disposed on said support layer;*
   *(iii) an ablation layer that is disposed on said layer of solid photocurable material, wherein said ablation layer is substantially opaque to actinic radiation and is capable of being ablated by a laser;*

*b) transferring graphic data to said solid photocurable printing element by selectively ablating portions of said ablation layer with a laser to create an image;*

*c) back exposing said solid photocurable printing element to actinic radiation through said support layer;*

*d) exposing said solid photocurable printing element to actinic radiation through the portions of the ablation layer that have been ablated to cure the solid photocurable printing element; and*

*e) removing uncured photocurable material and any remaining ablation layer from said solid photocurable printing element.*

*14. A method according to claim 13 wherein said support layer comprises a material selected from the group consisting of polyethylene terephthalate, polyethylene naphthalate, polyether, polyethylene, polyamide and nylon.*

*15. A method according to claim 13 wherein said support layer comprises polyethylene terephthalate.*

*16. A method according to any one of claims 13, 14, or 15 wherein said support layer absorbs between about 80% and 99% of the actinic radiation used in said back exposing.*

*17. A method according to any one of claims 13, 14, or 15 wherein said support layer absorbs between about 85% and 95% of the actinic radiation used in said back exposing.*

*18. A method according to any one of claims 13, 14, or 15 wherein the actinic radiation has a wavelength in the range from 300 nm to 400 nm and said support layer absorbs between about 80% and 99% of the actinic radiation used in said back exposing.*

*19. A method for producing a flexographic printing plate, said method comprising:*

*a) providing at least one solid photocurable printing element comprising:*
   *(i) an inherently UV-absorbing support layer;*
   *(ii) a layer of solid photocurable material disposed on said support layer;*
   *(iii) an ablation layer that is disposed on said layer of solid photocurable material, wherein said ablation layer is substantially opaque to actinic radiation and is capable of being ablated by a laser;*

*b) transferring graphic data to said solid photocurable printing element by selectively ablating portions of said ablation layer with a laser to create an image;*

*c) back exposing said solid photocurable printing element to actinic radiation through said support layer;*

*d) exposing said solid photocurable printing element to actinic radiation through the portions of the ablation layer that have been ablated; and*

*e) removing uncured photocurable material and any remaining ablation layer from said solid photocurable printing element.*

*20. A method according to claim 19 wherein the inherently UV-absorbing support layer comprises polyethylene naphthalate.*

*21. A method according to claim 20 wherein the support layer is from about 3 to 5 mils thick.*

*22. A method according to any one of claims 19, 20, or 21 wherein said support layer absorbs between about 80% and 99% of the actinic radiation used in said back exposing.*

*23. A method according to any one of claims 19, 20, or 21 wherein said support layer absorbs between about 85% and 95% of the actinic radiation used in said back exposing.*

*24. A flexographic printing plate element comprising:*

*a) a support layer which is capable of absorbing between about 80% and 99% of the actinic radiation used to back expose said printing plate element;*

*b) at least one layer of solid photocurable material disposed on said support layer; and*

*c) an ablation layer capable of being ablated by laser radiation and which is substantially opaque to actinic radiation.*

*25. A flexographic printing plate element according to claim 24 wherein said support layer comprises polyethylene terephthalate.*

*26. A flexographic printing plate element according to claim 24 wherein said support layer comprises a material selected from the group consisting of polyethylene terephthalate, polyethylene naphthalate, polyether, polyethylene, polyamide and nylon, and wherein said material has an actinic radiation absorbing compound uniformly distributed throughout.*

*27. A flexographic printing plate element according to any one of claims 24, 25, or 26 wherein the support layer is from about 3 to 5 mils thick.*

*28. A flexographic printing plate element according to any of claims 24, 25, or 26 wherein said solid photocurable material comprises an oxygen scavenger.*

*29. A flexographic printing plate element according to claim 28 wherein the oxygen scavenger is a compound selected from the group consisting of triphenylphosphine, triphenyl phosphite, tri-p-tolylphosphine, diphenylmethylphosphine, diphenylethylphosphine, diphenylpropylphosphine, dimethylphenylphosphine, diethylphenylphosphine, dipropylphenylphosphine, divinylphenylphosphine, divinyl-p-methoxyphenylphosphine, divinyl-p-bromophenylphosphine, divinyl-p-tolylphosphine, diallylphenylphosphine, diallyl-p-methoxyphenylphosphine, diallyl-p-bromophenylphosphine and diallyl-p-tolylphsphine.*

*30. A flexographic printing plate element comprising:*

*a. a support layer comprising an actinic radiation absorbing compound uniformly distributed throughout said support layer;*

*b. at least one layer of solid photocurable material disposed on said support layer; and*

*c. an ablation layer capable of being ablated by laser radiation and which is substantially opaque to actinic radiation.*

*31. A flexographic printing plate element according to claim 30 wherein the support layer comprises polyethylene terephthalate.*

* * * * *